(12) United States Patent
Cho (10) Patent No.: US 10,692,901 B2
(45) Date of Patent: Jun. 23, 2020

(54) ARRAY SUBSTRATE AND MANUFACTURING METHOD THEREOF

(71) Applicants: HKC Corporation Limited, Shenzhen (CN); Chongqing HKC Optoelectronics Technology Co., ltd., Chongqing (CN)

(72) Inventor: En-Tsung Cho, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/341,740

(22) PCT Filed: Aug. 15, 2018

(86) PCT No.: PCT/CN2018/100590
§ 371 (c)(1),
(2) Date: Apr. 12, 2019

(87) PCT Pub. No.: WO2019/042126
PCT Pub. Date: Mar. 7, 2019

(65) Prior Publication Data
US 2020/0052009 A1    Feb. 13, 2020

(30) Foreign Application Priority Data

Aug. 29, 2017    (CN) .......................... 2017 1 0755000

(51) Int. Cl.
*H01L 27/12* (2006.01)
*H01L 29/786* (2006.01)
(Continued)

(52) U.S. Cl.
CPC ........ *H01L 27/1288* (2013.01); *H01L 27/127* (2013.01); *H01L 27/1222* (2013.01);
(Continued)

(58) Field of Classification Search
CPC ............... H01L 27/1222; H01L 27/127; H01L 27/1259; H01L 27/1262; H01L 27/1288;
(Continued)

(56) References Cited

U.S. PATENT DOCUMENTS 10,453,963 B2 * 10/2019 He ..................... H01L 29/78609
2011/0168997 A1 * 7/2011 Lee ..................... H01L 27/1255
257/57

(Continued)

*Primary Examiner* — Mohsen Ahmadi
(74) *Attorney, Agent, or Firm* — WPAT, PC (57) ABSTRACT

An array substrate and a manufacturing method thereof are provided. The manufacturing method includes steps of: providing a first substrate; providing a first mask and arranging active switches on the first substrate; providing a second mask, forming a photoresist layer on the active switches and sequentially performing following steps of: performing a first wet etching on the active switches, performing a first ashing treatment on the photoresist layer, performing a first dry etching on the active switches, performing a second wet etching on the active switches, performing a second ashing treatment on the photoresist layer and performing a second dry etching on the active switches; providing a third mask and forming a protective layer on a metal layer of the active switches; and providing a fourth mask and forming a pixel electrode layer on the protective layer.

13 Claims, 7 Drawing Sheets

(51) Int. Cl.
*H01L 29/66* (2006.01)
*H01L 21/308* (2006.01)

(52) U.S. Cl.
CPC ...... *H01L 29/78669* (2013.01); *H01L 21/308* (2013.01); *H01L 21/3086* (2013.01); *H01L 27/1259* (2013.01); *H01L 27/1262* (2013.01)

(58) Field of Classification Search
CPC ........... H01L 29/78669; H01L 21/3086; H01L 21/308
See application file for complete search history.

(56) References Cited

U.S. PATENT DOCUMENTS

| | | | |
|---|---|---|---|
| 2014/0054580 A1* | 2/2014 | Ning | H01L 29/66765 257/43 |
| 2018/0211985 A1* | 7/2018 | Zhao | H01L 27/1288 |
| 2018/0292696 A1* | 10/2018 | Choi | G02F 1/1368 |
| 2018/0308879 A1* | 10/2018 | Liu | H01L 27/1288 |
| 2018/0308880 A1* | 10/2018 | Liu | H01L 27/1292 |
| 2019/0013409 A1* | 1/2019 | Li | H01L 29/78633 |
| 2019/0074305 A1* | 3/2019 | Gong | H01L 29/78684 |
| 2019/0198677 A1* | 6/2019 | Wu | H01L 29/66969 |
| 2019/0206902 A1* | 7/2019 | Zhou | H01L 21/3086 |
| 2020/0043947 A1* | 2/2020 | Shi | H01L 27/124 |

* cited by examiner

ARRAY SUBSTRATE AND MANUFACTURING METHOD THEREOF

FIELD OF THE DISCLOSURE

The disclosure relates to the field of display technology, and more particularly to an array substrate and a manufacturing method thereof.

BACKGROUND

Exemplary display devices usually are controlled based on active switches and have numerous advantages such as thin body, energy saving and radiation-free and thus have been widely used. The display devices primarily include liquid crystal display devices, OLED (Organic Light-Emitting Diode) display devices, QLED (Quantum Dot Light Emitting Diodes) display devices, plasma display devices and so on, and in terms of appearance structures, they may be flat-type display devices and/or curved-type display devices.

As to the liquid crystal display device, it includes two parts such as a liquid crystal panel and a backlight module. A working principle of the liquid crystal display device is disposing liquid crystal molecules between two parallel glass substrates and applying a driving voltage onto the two glass substrate to control rotation directions of the liquid crystal molecules to refract light rays from the backlight module and thereby produce an image.

With regard to the OLED display device, it uses the self-luminous organic light emitting diodes to achieve a display and has advantages of self-luminous, wide viewing angle, almost infinite high contrast, low power consumption, high response speed and so on.

The QLED display device has a structure very similar to that of the OLED and a main difference is that a luminescent center of the QLED consists of quantum dots. Electrons and holes at two sides of the structure will combine in a quantum dot layer to form excitons and thereby emit light through recombination of the excitons.

With the developments of display devices gradually aiming at super-size, high driving frequency, high resolution and other aspects, a TFT structure is often an inverted staggered structure, that is, a gate electrode is at the bottom and source/drain electrodes are respectively located on both sides of an α-Si layer. As to such device structure, in on aspect, because the AS (active semiconductor) tail is excessively long, it will produce a leakage current, resulting in neither safe nor energy saving and also being adverse to normal operation of equipment; and in another aspect, often due to excessively small line width of the source/drain electrode layers after etching treatments, there may be a risk of line broken.

SUMMARY

An objective of the disclosure is to provide a manufacturing method of an array substrate capable of reducing leakage current.

In order to achieve the above objective, a manufacturing method of an array substrate according to an embodiment of the disclosure includes steps of: providing a first substrate; forming active switches on the first substrate; forming a photoresist layer on the active switches; performing a first wet etching on the active switches; performing a first ashing treatment on the photoresist layer; performing a first dry etching on the active switches; performing a second wet etching on the active switches; performing a second ashing treatment on the photoresist layer; and performing a second dry etching on the active switches.

In an embodiment, the step of forming active switches on the first substrate includes: depositing a gate electrode layer on the first substrate; depositing an insulating layer on the gate electrode layer; depositing an amorphous silicon layer on the insulating layer; depositing an ohmic contact layer on the amorphous silicon layer; and depositing the metal layer on the ohmic contact layer.

Here are the arrangements of the gate electrode layer, the insulating layer, the amorphous silicon layer, the ohmic contact layer and the metal layer of the active switches being deposited on the first substrate under a preceding mask, which is the preparation for subsequent two wet etchings, two dry etchings and ashing treatments.

In an embodiment, after the step of performing a second dry etching on the active switches, the manufacturing method further includes: forming a protective layer on the metal layer.

Here is the arrangement of a functional layer of the active switches under a succeeding mask, it ensures the achievement of device function of the active switches.

In an embodiment, after the step of forming a protective layer on the metal layer, the manufacturing method further includes: forming a pixel electrode layer on the protective layer.

Here is the arrangement of a functional layer of the active switches under a succeeding mask, it ensures the achievement of device function of the active switches.

In an embodiment, the insulating layer, the amorphous silicon layer and the ohmic contact layer constitute a combination layer; the step of forming a photoresist layer on the active switches includes: disposing the photoresist layer on the protective layer, and an edge of the photoresist layer being aligned with a same side edge of the metal layer; after the step of performing a first wet etching on the active switches, dimension ranges of the metal layer and the protective layer are reduced to a first range; after the step of performing a first ashing treatment on the photoresist layer, a dimension range of the photoresist layer is reduced to a second range; after the step of performing a first dry etching on the active switches, a dimension range of the combination layer is reduced to a third range, and an edge of the combination layer is aligned with a same side edge of the metal layer; and after the step of performing a second wet etching on the active switches, the dimension ranges of the metal layer and the protective layer are reduced to a fourth range.

Here are changes of the respective layers and the photoresist layer in the steps of etching and ashing treatment.

In an embodiment, the dimension ranges of the metal layer and the protective layer are reduced to a first range includes: an edge of the combination layer is longer with 0.165 micrometers than a same side edge of the metal layer, and an edge of the metal layer is longer with 0.404 micrometers than a same side edge of the protective layer.

Here are arrangements in shape of respective layers after the etchings.

In an embodiment, the dimension ranges of the metal layer and the protective layer are reduced to a fourth range includes: an edge of the combination layer is distant with a predetermined length from a same side edge of the metal layer, and an edge of the metal layer is longer with 0.404 micrometers than a same side edge of the protective layer.

In an embodiment, after the step of performing a first wet etching on the active switches, the step of performing a first dry etching on the active switches and the step of performing a second wet etching on the active switches, the metal layer has a shape of trapezoid, the trapezoid includes a first base adjacent to the ohmic contact layer and a second base away from the ohmic contact layer, a length of the first base is greater than a length of the second base, and an edge of the first base is longer with 0.404 micrometers than a same side edge of the second base.

In an embodiment, the protective layer includes a first protective layer and a second protective; the insulating layer, the amorphous silicon layer and the ohmic contact layer constitute a combination layer; the first protective layer is disposed between the combination layer and the metal layer, and the second protective layer is disposed on the metal layer.

In an embodiment, the metal layer employs aluminum element, and the protective layer employs molybdenum element.

Here are specific material settings of respective layers. Aluminum is widely available, with ductility, light weight and corrosion resistant. Molybdenum is a silvery white metal and is hard and tough.

Another objective of the disclosure is to provide a manufacturing method of an array substrate, so as to reduce the risk of line broken in the source/drain electrode layers after etching treatments.

The manufacturing method of an array substrate includes steps of: providing a first substrate; providing a first mask for forming active switches on the first substrate, wherein the active switches include a metal layer; providing a second mask for forming a photoresist layer on the active switches, performing a first wet etching on the active switches, performing a first dry etching on the active switches, performing a second wet etching on the active switches and performing a second dry etching on the active switches, wherein an etching solution used for the metal layer includes phosphoric acid, acetic acid and nitric acid, and a concentration of the nitric acid in the etching solution is in a range from 1.8% to 3.0%; providing a third mask for forming a protective layer on the metal layer; and providing a fourth mask for forming a pixel electrode layer on the protective layer.

Still another objective of the disclosure is to provide an array substrate.

An array substrate includes: a first substrate and active switches. The active switches are disposed on the first substrate, and the active switches include an amorphous silicon layer, an ohmic contact layer and a metal layer. A length of an edge of the amorphous silicon layer beyond a same side edge of the metal layer is greater than a length of an edge of the ohmic contact layer beyond a same side edge of the metal layer.

In an embodiment, the edge of the amorphous silicon layer is longer with a first tail value than the same side edge of the metal layer, and the first tail value is smaller than 1.2 micrometers. The edge of the ohmic contact layer is longer with a second tail value than the same side edge of the metal layer, and the second tail value is smaller than 0.8 micrometers.

In an embodiment, the second tail value is multiple and the multiple second tail values include an outer side second tail value with which an outer side edge of the ohmic contact layer is longer than a same side edge of the metal layer, and an inner side second tail value witch which an inner side edge of the ohmic contact layer is longer than a same side edge of the metal layer; and the outer side second tail value is greater than the inner side second tail value.

Here are different length settings of the outer side edge and the inner side edge of the ohmic contact layer with respect to same side edges of the metal layer, and the further limitation under the setting of the second tail values being smaller than 0.8 μm not only can realize the reduction of leakage current but also can ensure the normal achievement of function of channel.

The disclosure in one aspect adds ashing treatments among the etching steps (2W2D: two wet etchings and two dry etchings) to reduce edge lengths of the amorphous silicon layer and the ohmic contact layer of the active switches, and therefore possible adverse effects caused by the leakage current of display panel can be reduced; and in another aspect, because in the etching steps (2W2D: two wet etchings and two dry etchings), the concentration of nitric acid in an etching solution for the metal layer is reduced, the edge lengths of the amorphous silicon layer and the ohmic contact layer of the active switches are controlled to be reduced, so that the risk of possible line broken resulting from relatively small line width of source/drain electrode layers is reduced consequently.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the drawings.

DETAILED DESCRIPTION OF EMBODIMENTS

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "include" and any variations thereof are meant to cover a non-exclusive inclusion.

In the description of the disclosure, it should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "include" and/or "contain" define the existence of described features, integers, steps, operations, units and/or components, but do not exclude the existence or addition of one or more other features, integers, steps, operations, units, components and/or combinations thereof.

In the drawings, elements/components with similar structures are denoted by same reference numerals.

An array substrate and a manufacturing method thereof of the disclosure will be further described below with reference to embodiments associated with FIG. 1 through FIG. 6.

Figure 1:
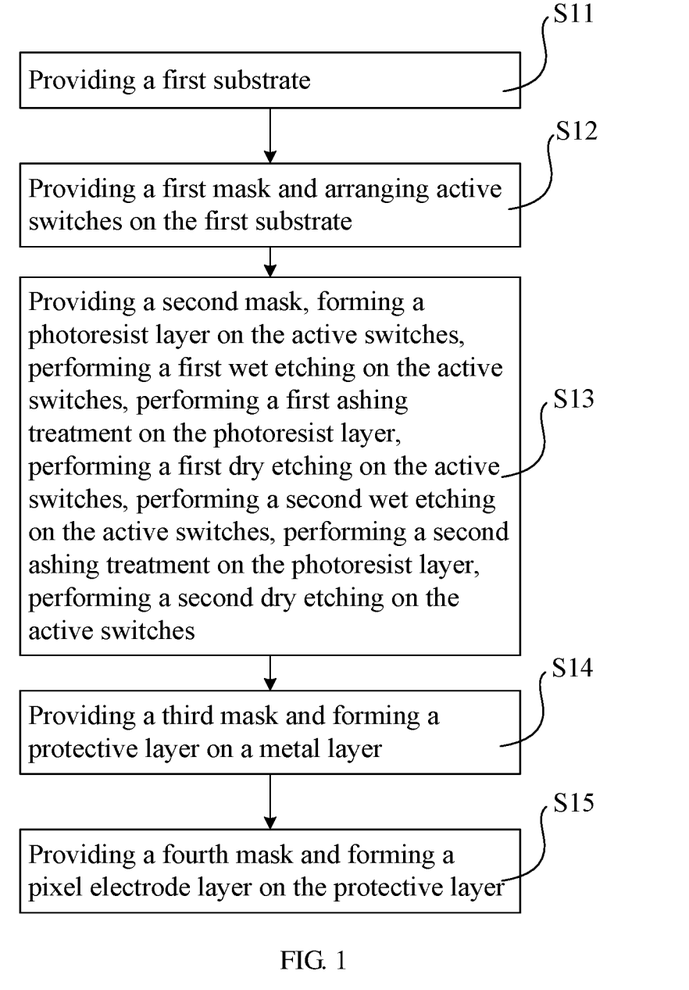
FIG. 1 is a flow chart of a manufacturing method of an array substrate according to an embodiment of the disclosure.

As an embodiment of the disclosure, referring to FIG. 1, the manufacturing method includes steps of:
  providing a first substrate 10;
  forming active switches on the first substrate 10;
  forming a photoresist layer 40 on the active switches;
  performing a first wet etching on the active switches;
  performing a first ashing treatment on the photoresist layer 40;
  performing a first dry etching on the active switches;
  performing a second wet etching on the active switches;
  performing a second ashing treatment on the photoresist layer 40;
  performing a second dry etching on the active switches.

In the disclosure, because the ashing treatment steps are added among the etching steps (2W2D: two wet etchings and two dry etchings) to reduce edge lengths of an amorphous silicon layer 23 and an ohmic contact layer 24 of the active switches, possible adverse effects caused by the leakage current of display panel are reduced consequently. The wet etching is an etching method of stripping off an etched material by a chemical reaction between a chemical etching solution and the etched material. Most of wet etchings are isotropic etchings of being not easily controlled. The wet etching has advantages of strong adaptability, good surface uniformity, less damage to the silicon, and thus is suitable for almost all metals, glasses, plastics and other materials. The dry etching uses plasma as an etchant and is a process of using the plasma to react with a surface film for forming volatile substances or directly bombard a film surface so that it is corroded. The dry etching can achieve anisotropic etching and thus can ensure the fidelity of small patterns after being transferred. The combination of the two etching methods not only can guarantee the fidelity and minimum line width of an etching pattern, but also can control manufacturing cost.

Figure 2:
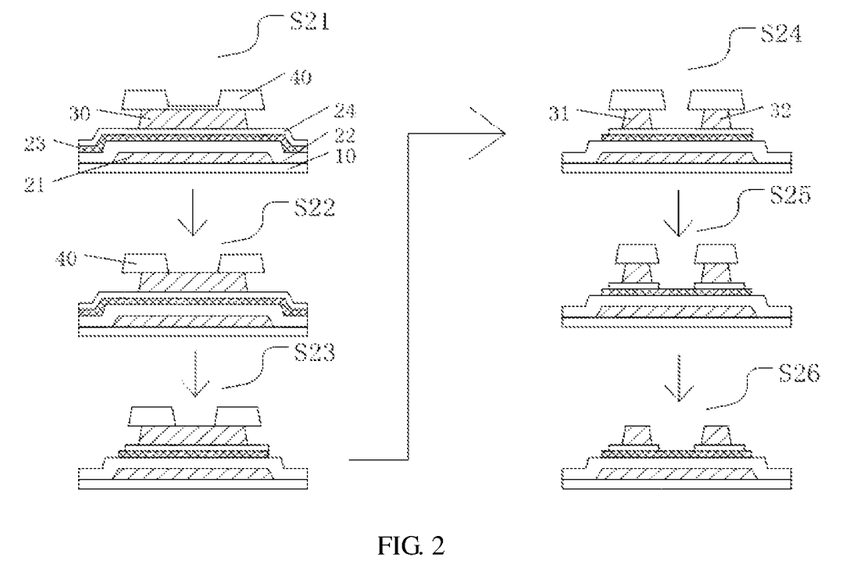
FIG. 2 is a schematic view of structures in a manufacturing process of an active switch of an array substrate according to an embodiment of the disclosure.
Figure 3:
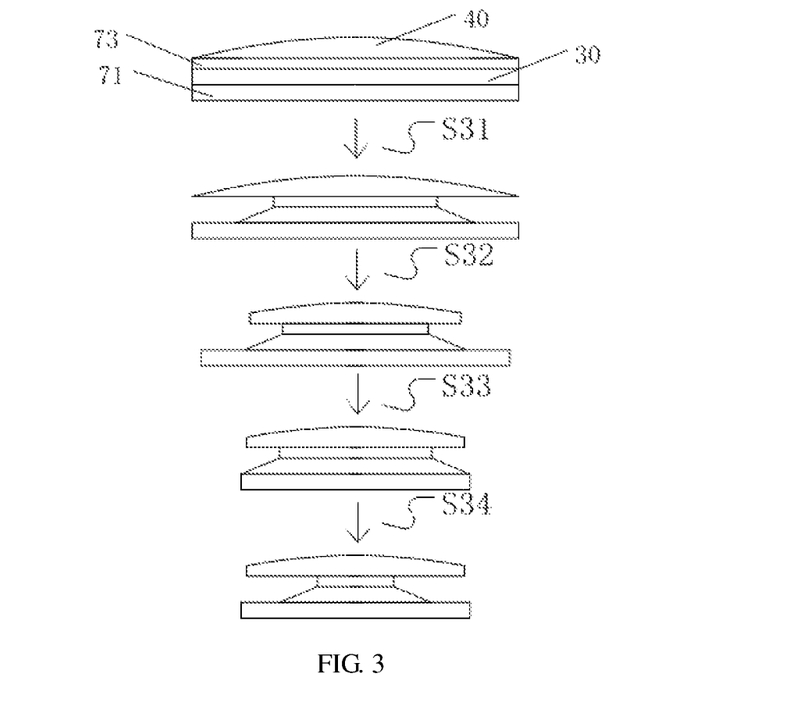
FIG. 3 is a schematic view of structures in a manufacturing process of respective layers of an active switch of an array substrate according to an embodiment of the disclosure.

As another embodiment of the disclosure, referring to FIGS. 1 through 3, the manufacturing method includes steps of:
  providing a first substrate 10;
  forming active switches on the first substrate 10;
  forming a photoresist layer 40 on the active switches;
  performing a first wet etching on the active switches;
  performing a first ashing treatment on the photoresist layer 40;
  performing a first dry etching on the active switches;
  performing a second wet etching on the active switches;
  performing a second ashing treatment on the photoresist layer 40;
  performing a second dry etching on the active switches.

In particular, as shown in FIG. 2 (S21: first wet etching; S22: first ashing treatment; S23: first dry etching; S24: second wet etching; S25: second ashing treatment; S26: second dry etching), the active switches disposed on the first substrate 10 from bottom to top includes a gate electrode layer 21, an insulating layer 22, an amorphous silicon layer 23, an ohmic contact layer 24 and a metal layer 30 constituted by a source electrode layer 31 and a drain electrode layer 32. The active switches have a photoresist layer 40 disposed thereon. Along with the performing of the etchings and the ashing treatments (to make the dimension range of the photoresist layer 40 be reduced with a predetermined range), respective layers in the active switches are progressively shaped/formed. An edge of the amorphous silicon 23 is longer than the same side edge of the metal layer, an edge of the ohmic contact layer 24 is longer than the same side edge of the metal layer, and a difference between an outer side edge of the ohmic contact layer 24 and the same side edge of the metal layer is greater than a difference between an inner side edge of the ohmic contact layer 24 and the same side edge of the metal layer.

By adding the ashing treatments among the etching steps (2W2D: two wet etchings and two dry etchings) to reduce edge lengths of the amorphous silicon layer 23 and the ohmic contact layer 24 of the active switches, possible adverse effects caused by the leakage current of display panel are reduced consequently. The wet etching is an etching method of stripping off an etched material by a chemical reaction between a chemical etching solution and the etched material. Most of wet etchings are isotropic etchings of being not easily controlled. The wet etching has advantages of strong adaptability, good surface uniformity, less damage to the silicon, and thus is suitable for almost all metals, glasses, plastics and other materials. The dry etching uses plasma as an etchant and is a process of using the plasma to react with a surface film for forming volatile substances or directly bombard a film surface so that it is corroded. The dry etching can achieve anisotropic etching and thus can ensure the fidelity of small patterns after being transferred. The combination of the two not only can guarantee the fidelity and minimum line width of an etching pattern, but also can control manufacturing cost.

As still another embodiment of the disclosure, referring to FIGS. 1 through 3, the manufacturing method includes steps of:

providing a first substrate 10;
forming active switches on the first substrate 10;
forming a photoresist layer 40 on the active switches;
performing a first wet etching on the active switches;
performing a first ashing treatment on the photoresist layer 40;
performing a first dry etching on the active switches;
performing a second wet etching on the active switches;
performing a second ashing treatment on the photoresist layer 40;
performing a second dry etching on the active switches.

In particular, as shown in FIG. 3 (S31: first wet etching; S32: ashing treatment; S33: first dry etching; S34: second wet etching), the insulating layer 22, the amorphous silicon layer 23 and the ohmic contact layer 24 constitute a combination layer 71. The step of disposing a photoresist layer 40 on the active switches include: disposing the photoresist layer 40 on a protective layer 73, and an edge of the photoresist layer 40 being aligned/flush with the same side edge of the metal layer.

After the step of performing a first wet etching on the active switches, dimension ranges of the metal layer 30 and the protective layer 73 are reduced to a first range, that is, an edge of the combination layer 71 is longer with 0.165 micrometers than the same side edge of the metal layer 30, and an edge of the metal layer 30 is longer with 0.404 micrometers than the same side edge of the protective layer 73.

After the step of performing a first ashing treatment on the photoresist layer 40, a dimension range of the photoresist layer 40 is reduced to a second range.

After the step of performing the first dry etching on the active switches, a dimension range of the combination layer 71 is reduced to a third range, i.e., an edge of the combination layer 71 is aligned/flush with the same side edge of the metal layer 30.

After the step of performing a second wet etching on the active switches, the dimension ranges of the metal layer 30 and the protective layer 73 are reduced to a fourth range, i.e., an edge of the combination layer 71 is distant with a predetermined length from the same side edge of the meta layer 30, and an edge of the metal layer 30 is longer with 0.404 micrometers than the same side edge of the protective layer 73.

By adding the ashing treatments among the etching steps (2W2D: two wet etchings and two dry etchings) to reduce edge lengths of the amorphous silicon layer 23 and the ohmic contact layer 24 of each the active switch, possible adverse effects caused by the leakage current of display panel are reduced consequently. The wet etching is an etching method of stripping off an etched material by a chemical reaction between a chemical etching solution and the etched material. Most of wet etchings are isotropic etchings of being not easily controlled. The wet etching has advantages of strong adaptability, good surface uniformity, less damage to the silicon, and thus is suitable for almost all metals, glasses, plastics and other materials. The dry etching uses plasma as an etchant and is a process of using the plasma to react with a surface film for forming volatile substances or directly bombard a film surface so that it is corroded. The dry etching can achieve anisotropic etching and thus can ensure the fidelity of small patterns after being transferred. The combination of the two not only can guarantee the fidelity and minimum line width of an etching pattern, but also can control manufacturing cost.

More specifically, after the step of performing a first wet etching on the active switches, the step of performing a first dry etching on the active switches and the step of performing a second wet etching on the active switches, the metal layer 30 has a shape of trapezoid. The trapezoid includes a first base adjacent to the ohmic contact layer 24 and a second base away from the ohmic contact layer 24, a length of the first base is longer than a length of the second base, and an edge of the first base is longer with 0.404 micrometers than the same side edge of the second base.

In particular, the metal layer 30 employs an aluminum element, and the protective layer 73 employs a molybdenum element. Aluminum is widely available, with ductility, light weight and corrosion resistant. Molybdenum is a silvery white metal and is hard and tough.

Figure 4:
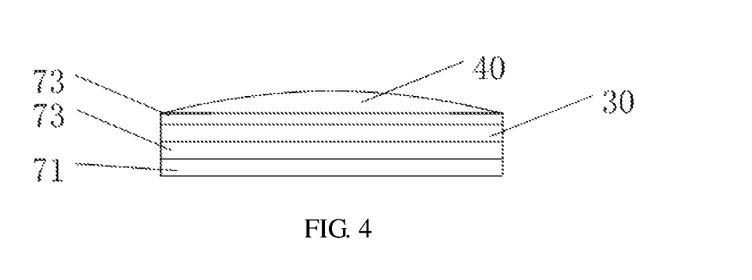
FIG. 4 is a schematic structural view of respective layers of an array substrate according to an embodiment of the disclosure.

Alternatively, as shown in FIG. 4, the protective layer 73 includes a first protective layer and a second protective layer; the insulating layer 22, the amorphous silicon layer 23 and the ohmic contact layer 24 constitute a combination layer 71; the first protective layer is disposed between the combination layer 71 and the metal layer 30, and the second protective layer is disposed on the metal layer 30.

As even still another embodiment of the disclosure, as shown in FIGS. 1 through 3, the manufacturing method includes steps of:

S11: providing a first substrate 10;
S12: providing a first mask and arranging active switches on the first substrate, e.g., depositing a gate electrode layer 21 on the first substrate 10, depositing an insulating layer 22 on the gate electrode layer 21, depositing an amorphous silicon layer 23 on the insulating layer 22, depositing an ohmic contact layer 24 on the amorphous silicon layer 23, and depositing a metal layer on the ohmic contact layer 24;
S13: providing a second mask, forming a photoresist layer 40 on the active switches, performing a first wet etching on the active switches, performing a first ashing treatment on the photoresist layer 40, performing a first dry etching on the active switches, performing a second wet etching on the active switches, performing a second ashing treatment on the photoresist layer 40, and performing a second dry etching on the active switches;
S14: providing a third mask and forming a protective layer on the metal layer;
S15: providing a fourth mask and forming a pixel electrode layer on the protective layer.

By adding the ashing treatments among the etching steps (2W2D: two wet etchings and two dry etchings) to reduce edge lengths of the amorphous silicon layer 23 and the ohmic contact layer 24 of the active switches, possible adverse effects caused by the leakage current of display panel are reduced consequently. The wet etching is an etching method of stripping off an etched material by a chemical reaction between a chemical etching solution and the etched material. Most of wet etchings are isotropic etchings of being not easily controlled. The wet etching has advantages of strong adaptability, good surface uniformity, less damage to the silicon, and thus is suitable for almost all metals, glasses, plastics and other materials. The dry etching uses plasma as an etchant and is a process of using the plasma to react with a surface film for forming volatile substances or directly bombard a film surface so that it is corroded. The dry etching can achieve anisotropic etching and thus can ensure the fidelity of small patterns after being transferred. The combination of the two not only can guarantee the fidelity and minimum line width of an etching pattern, but also can control manufacturing cost.

In particular, the arrangements of the gate electrode layer 21, the insulating layer 22, the amorphous silicon layer 23, the ohmic contact layer 24 and the metal layer 30 of each the active switch being deposited on the first substrate 10 under the first mask are the preparation for subsequent two wet etchings, two dry etching and ashing treatments. A chemical vapor deposition can be used. The arrangements of functional layers for the active switches under the third and fourth masks can ensure the achievement of device function of the active switches.

Figure 5:
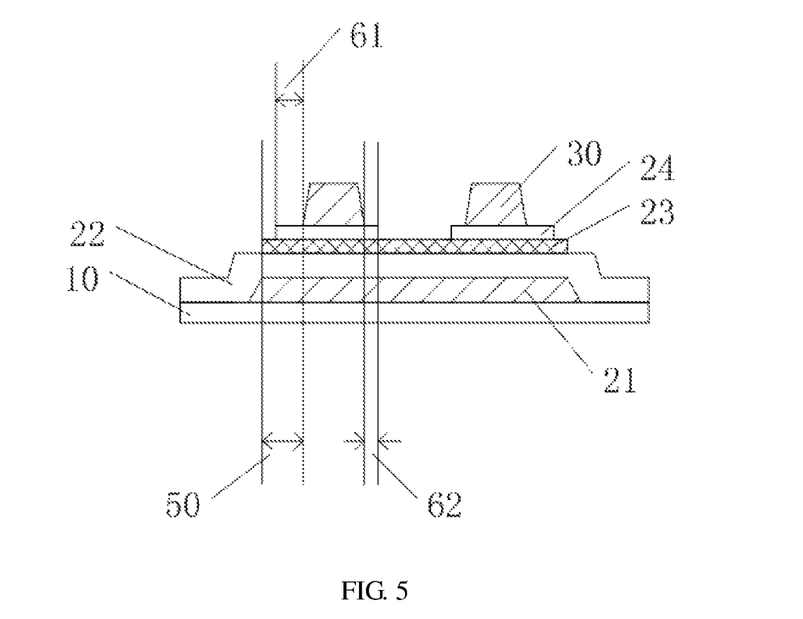
FIG. 5 is a schematic structural view of an active switch of an array substrate according to an embodiment of the disclosure.

As an embodiment of the disclosure, as shown in FIG. 5, the array substrate includes: a first substrate 10 and active switches (one active switch is shown for illustration). The active switch is disposed on the first substrate 10. The active switch includes an amorphous silicon layer 23, an ohmic contact layer 24 and a metal layer. An edge of the amorphous silicon layer 23 is longer with a first tail value 50 than the same side edge of the metal layer, and the first tail value 50 is smaller than 1.2 μm (micrometers). An edge of the ohmic contact layer 24 is longer with a second tail value than the same side edge of the metal layer, and the second tail value is smaller than 0.8 μm. By adding the ashing treatments among the etching steps (2W2D: two wet etchings and two dry etchings) to reduce edge lengths of the amorphous silicon layer 23 and the ohmic contact layer 24 of the active switch, possible adverse effects caused by the leakage current of display panel are reduced consequently.

As another embodiment of the disclosure, as shown in FIG. 5, the array substrate includes a first substrate 10 and active switches. Each the active switch is disposed on the first substrate 10. The active switch includes an amorphous silicon layer 23, an ohmic contact layer 24 and a metal layer. An edge of the amorphous silicon layer 23 is longer with a first tail value 50 than the same side edge of the metal layer, and the first tail value 50 is smaller than 1.2 μm. An edge of the ohmic contact layer 24 is longer with a second tail value than the same side edge of the metal layer, and the second tail value is smaller than 0.8 μm. By adding the ashing treatments among the etching steps (2W2D: two wet etchings and two dry etchings) to reduce edge lengths of the amorphous silicon layer 23 and the ohmic contact layer 24 in the active switch, possible adverse effects caused by the leakage current of display panel are reduced consequently. The second tail values include an outer side second tail value 61 with which the outer side edge of the ohmic contact layer 24 is longer than the same side edge of the metal layer, and an inner side second tail value 62 with which the inner side edge of the ohmic contact layer 24 is longer than the same side edge of the metal layer. The outer side second tail value 61 is greater than the inner side second tail value 62. The further limitation under the setting of the second tail values being smaller than 0.8 μm not only can realize the reduction of leakage current but also can ensure normal achievement of function of channel.

In the above embodiments, the display panel may be a liquid crystal panel, an OLED (Organic Light-Emitting Diode) panel, a QLED (Quantum Dot Light Emitting Diodes) panel, a plasma panel, a flat-type panel, or a curved-type panel and so on.

Figure 6:
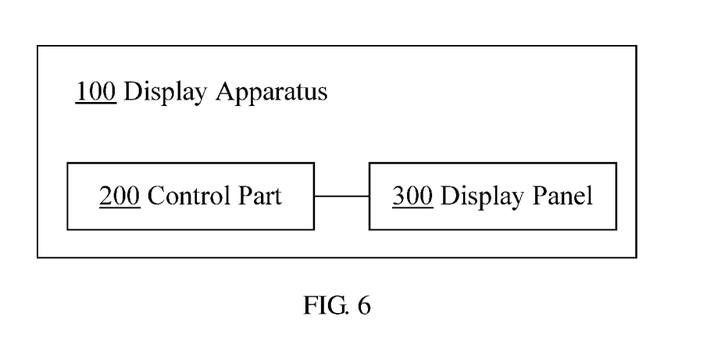
FIG. 6 is a schematic view of a display apparatus according to an embodiment of the disclosure.

Referring to FIG. 6, an embodiment provides a display apparatus 10. The display apparatus 100 includes a control part 200 and the display panel 300 as described in the disclosure. The above uses the display panel as an example to describe in detail, it should be noted that, the above description for the structure of the display panel also is applicable to the display apparatus of the illustrated embodiment of the disclosure. When the display apparatus of the illustrated embodiment of the disclosure is a liquid crystal display, the liquid crystal display includes a backlight module, and the backlight module may be used as a light source and for supplying a light source with sufficient brightness and uniform distribution. The backlight module in the illustrated embodiment may be front light type or backlight type, and it should be noted that the backlight module of the illustrated embodiment is not limited to these.

In the following, a manufacturing method of an array substrate according to another embodiment will be described with reference to FIG. 7 through FIG. 12.

Figure 7:
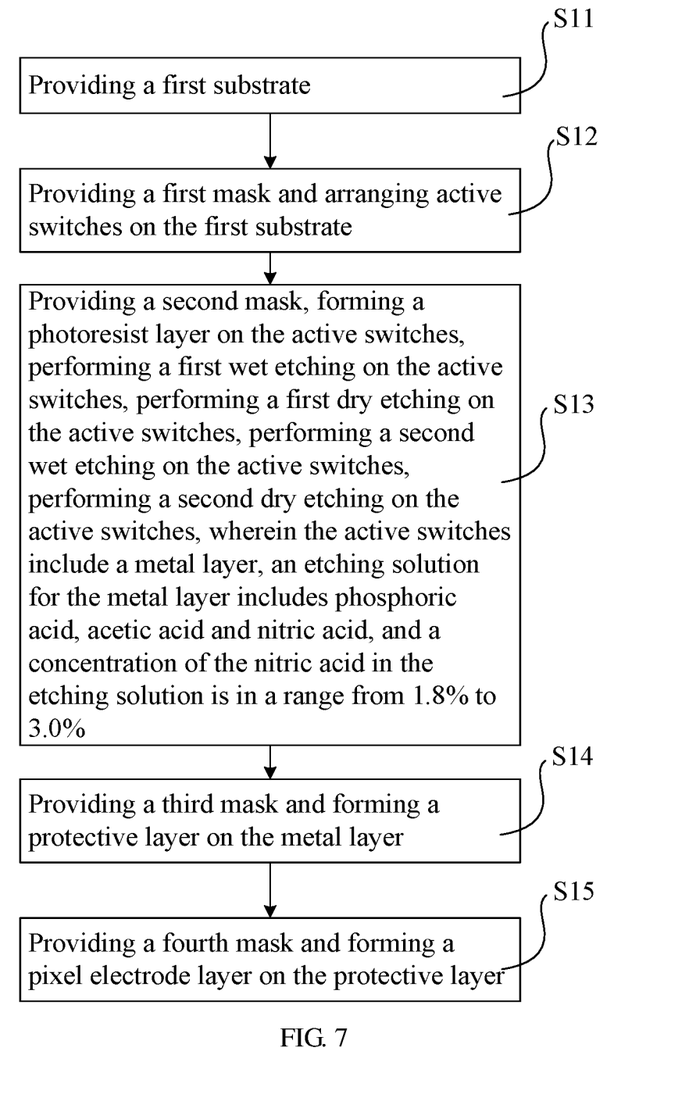
FIG. 7 is a flow chart of a manufacturing method of an array substrate according to another embodiment of the disclosure.

As an embodiment of the disclosure, referring to FIG. 7, the manufacturing method includes steps of:
  providing a first substrate 10;
  forming active switches on the first substrate 10;
  forming a photoresist layer 40 on the active switches;
  performing a first wet etching on the active switches;
  performing a first dry etching on the active switches;
  performing a second wet etching on the active switches;
  performing a second dry etching on the active switches.

The active switches include a metal layer 30, an etching solution used for the metal layer 30 includes phosphoric acid, acetic acid and nitric acid, and a concentration of the nitric acid in the etching solution is in a range from 1.8% to 3.0%. In particular, a concentration of the phosphoric acid in the etching solution is in a range from 60% to 80%, and a concentration of the acetic acid in the etching solution is in a range from 5% to 15%.

The disclosure reduces the concentration of the nitric acid in the etching solution for the metal layer in the etching steps (2W2D: two wet etchings and two dry etchings), edge lengths of the amorphous silicon layer 23 and the ohmic contact layer 24 of the active switch are controlled to be reduced, so that the risk of line broken caused by relatively small line width of the source/drain electrode layers is reduced consequently. The wet etching is an etching method of stripping off an etched material by a chemical reaction between a chemical etching solution and the etched material. Most of wet etchings are isotropic etchings of being not easily controlled. The wet etching has advantages of strong adaptability, good surface uniformity, less damage to the silicon, and thus is suitable for almost all metals, glasses, plastics and other materials. The dry etching uses plasma as an etchant and is a process of using the plasma to react with a surface film for forming volatile substances or directly bombard a film surface so that it is corroded. The dry etching can achieve anisotropic etching and thus can ensure the fidelity of small patterns after being transferred. The combination of the two not only can guarantee the fidelity and minimum line width of an etching pattern, but also can control manufacturing cost.

Figure 8:
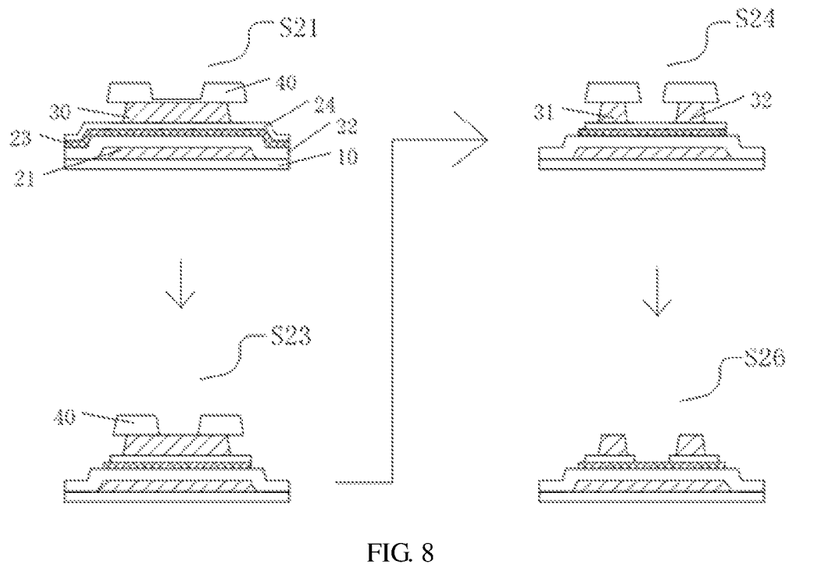
FIG. 8 is a schematic view of structures in a manufacturing process of an active switch of an array substrate according to another embodiment of the disclosure.
Figure 9:
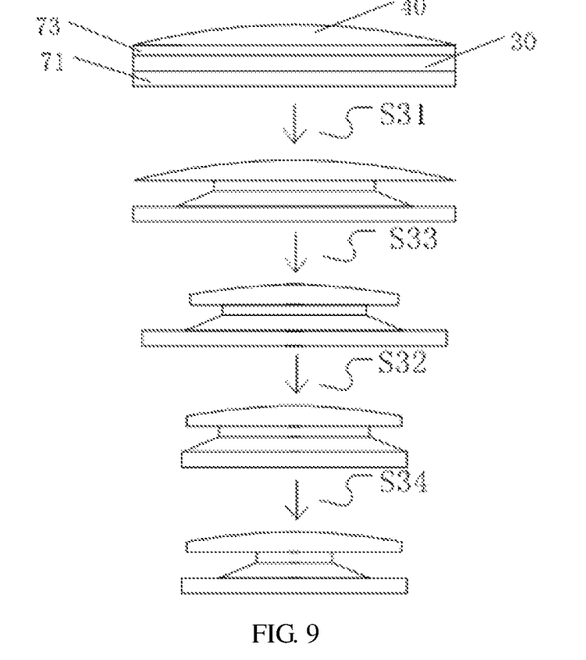
FIG. 9 is a schematic view of structures in a manufacturing process of respective layers of an active switch of an array substrate according to another embodiment of the disclosure.

As another embodiment of the disclosure, referring to FIGS. 7 through 9, the manufacturing method includes steps of:

providing a first substrate 10;
forming active switches on the first substrate 10;
forming a photoresist layer on the active switches;
performing a first wet etching on the active switches;
performing a first dry etching on the active switches;
performing a second wet etching on the active switches;
performing a second dry etching on the active switches.

The active switches each include a metal layer 30, an etching solution used for the metal layer 30 includes phosphoric acid, acetic acid and nitric acid, and a concentration of the nitric acid in the etching solution is in a range from 1.8% to 3.0%. In particular, a concentration of the phosphoric acid in the etching solution is in a range from 60% to 80%, and a concentration of the acetic acid in the etching solution is in a range from 5% to 15%.

As shown in FIG. 8 (S21: first wet etching; S23: first dry etching; S24: second wet etching; S26: second dry etching), the active switch disposed on the first substrate 10 from bottom to top includes: a gate electrode layer 21, an insulating layer 22, an amorphous silicon layer 23, an ohmic contact layer 24 and a metal layer 30 constituted by a source electrode layer 31 and a drain electrode layer 32. The active switches have the photoresist layer 40 disposed thereon. Along with the performing of the etchings and ashing treatments (to make a dimension range of the photoresist layer 40 be reduced with a predetermined range), respective layers in the active switch are progressively shaped/formed. An edge of the amorphous silicon layer 23 is longer than the same side edge of the metal layer, an edge of the ohmic contact layer 24 is longer than the same side edge of the metal layer, a difference between an outer side edge of the ohmic contact layer 24 and the same side edge of the metal layer is greater than a difference between an inner side edge of the ohmic contact layer 24 and the same side edge of the metal layer.

By reducing the concentration of the nitric acid in the etching solution for the metal layer in the etching steps (2W2D: two wet etchings and two dry etchings), edge lengths of the amorphous silicon layer 23 and the ohmic contact layer 24 of the active switch are controlled to be reduced, so that the risk of line broken caused by relatively small line width in the source/drain electrode layers is reduced consequently. The wet etching is an etching method of stripping off an etched material by a chemical reaction between a chemical etching solution and the etched material. Most of wet etchings are isotropic etchings of being not easily controlled. The wet etching has advantages of strong adaptability, good surface uniformity, less damage to the silicon, and thus is suitable for almost all metals, glasses, plastics and other materials. The dry etching uses plasma as an etchant and is a process of using the plasma to react with a surface film for forming volatile substances or directly bombard a film surface so that it is corroded. The dry etching can achieve anisotropic etching and thus can ensure the fidelity of small patterns after being transferred. The combination of the two not only can guarantee the fidelity and minimum line width of an etching pattern, but also can control manufacturing cost.

As still another embodiment of the disclosure, referring to FIGS. 7 through 9, the manufacturing method includes steps of:

providing a first substrate 10;
forming active switches on the first substrate 10;
forming a photoresist layer on the active switches;
performing a first wet etching on the active switches;
performing a first dry etching on the active switches;
performing a second wet etching on the active switches;
performing a second dry etching on the active switches.

The active switches include a metal layer 30, an etching solution used for the metal layer 30 includes phosphoric acid, acetic acid and nitric acid, and a concentration of the nitric acid in the etching solution is in a range from 1.8% to 3.0%. In particular, a concentration of the phosphoric acid in the etching solution is in a range from 60% to 80%, and a concentration of the acetic acid in the etching solution is in a range from 5% to 15%.

In particular, as shown in FIG. 9 (S31: first wet etching; S33: first dry etching; S32: ashing treatment; S34: second wet etching), the insulating layer 22, the amorphous silicon layer 23 and the ohmic contact layer 24 constitute a combination layer 71. Edges of the combination layer 71, the metal layer 30 and the protective layer 73 at a same side are aligned/flush with one another. The photoresist layer 40 is located in the dimension range of the protective layer 73.

After the step of performing a first wet etching on the active switches, dimension ranges of the metal layer 30 and the protective layer 73 are reduced to a first range.

After the step of performing a first dry etching on the active switches, a dimension range of the combination layer 71 is reduced to a second range.

After the step of performing a second wet etching on the active switches, the dimension ranges of the metal layer 30 and the protective layer 73 are reduced to a third range.

After the step of performing an ashing treatment on the photoresist layer 40, a dimension range of the photoresist layer 40 is reduced to a fourth range.

By reducing the concentration of the nitric acid in the etching solution for the metal layer in the etching steps (2W2D: two wet etchings and two dry etchings), edge lengths of the amorphous silicon layer 23 and the ohmic contact layer 24 of the active switch are controlled to be reduced, so that the risk of line broken caused by relatively small line width in the source/drain electrode layers is reduced consequently. The wet etching is an etching method of stripping off an etched material by a chemical reaction between a chemical etching solution and the etched material. Most of wet etchings are isotropic etchings of being not easily controlled. The wet etching has advantages of strong adaptability, good surface uniformity, less damage to the silicon, and thus is suitable for almost all metals, glasses, plastics and other materials. The dry etching uses plasma as an etchant and is a process of using the plasma to react with a surface film for forming volatile substances or directly bombard a film surface so that it is corroded. The dry etching can achieve anisotropic etching and thus can ensure the fidelity of small patterns after being transferred. The combination of the two not only can guarantee the fidelity and minimum line width of an etching pattern, but also can control manufacturing cost.

More specifically, the dimension range of the combination layer 71 is reduced to the second range, and the combination layer 71 has a shape of trapezoid. The trapezoid includes a first base adjacent to the ohmic contact layer 24 and a second base away from the ohmic contact layer 24, and a length of the first base is greater than a length of the second base.

In particular, the metal layer 30 employs an aluminum element, and the protective layer 73 employs a molybdenum element. Aluminum is widely available, with ductility, light weight and corrosion resistant. Molybdenum is a silvery white metal and is hard and tough.

Figure 10:
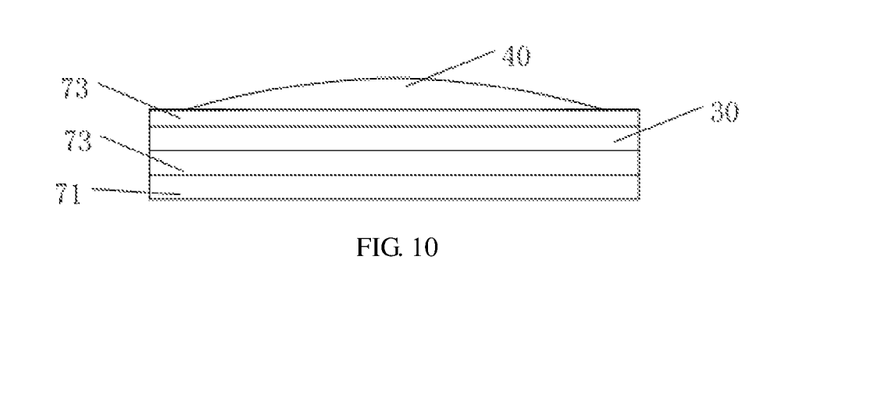
FIG. 10 is a schematic structural view of respective layers of an active switch of an array substrate according to another embodiment of the disclosure.

Alternatively, as shown in FIG. 10, the protective layer 73 includes a first protective layer and a second protective layer. The insulating layer 22, the amorphous silicon layer 23 and the ohmic contact layer 24 constitute a combination layer 71. The first protective layer is disposed between the combination layer 71 and the metal layer 30, and the second protective layer is disposed on the metal layer 30.

As even still another embodiment of the disclosure, as shown in FIGS. 7 through 9, the manufacturing method includes steps of:

S11: providing a first substrate 10;

S12: providing a first mask and arranging active switches on the first substrate 10, e.g., depositing a gate electrode layer 21 on the first substrate 10, depositing an insulating layer 22 on the gate electrode layer 21, depositing an amorphous silicon layer 23 on the insulating layer 22, depositing an ohmic contact layer 24 on the amorphous silicon layer 23, and depositing a metal layer on the ohmic contact layer 24;

S13: providing a second mask, forming a photoresist layer 40 on the active switches, performing a first wet etching on the active switches, performing a first dry etching on the active switches, performing a second wet etching on the active switches and performing a second dry etching on the active switches;

In particular, the active switches include a metal layer 30, an etching solution used for the metal layer 30 includes phosphoric acid, acetic acid and nitric acid, and a concentration of the nitric acid in the etching solution is in a range from 1.8% to 3.0%;

S14: providing a third mask and forming a protective layer on the metal layer;

S15: providing a fourth mask and forming a pixel electrode layer on the protective layer.

In particular, a concentration of the phosphoric acid in the etching solution is in a range from 60% to 80%, and a concentration of the acetic acid in the etching solution is in a range from 5% to 15%. By reducing the concentration of the nitric acid in the etching solution for the metal layer in the etching steps (2W2D: two wet etchings and two dry etchings), edge lengths of the amorphous silicon layer 23 and the ohmic contact layer 24 of the active switch are controlled to be reduced, so that the risk of line broken caused by relatively small line width in the source/drain electrode layers is reduced consequently. The wet etching is an etching method of stripping off an etched material by a chemical reaction between a chemical etching solution and the etched material. Most of wet etchings are isotropic etchings of being not easily controlled. The wet etching has advantages of strong adaptability, good surface uniformity, less damage to the silicon, and thus is suitable for almost all metals, glasses, plastics and other materials. The dry etching uses plasma as an etchant and is a process of using the plasma to react with a surface film for forming volatile substances or directly bombard a film surface so that it is corroded. The dry etching can achieve anisotropic etching and thus can ensure the fidelity of small patterns after being transferred. The combination of the two not only can guarantee the fidelity and minimum line width of an etching pattern, but also can control manufacturing cost.

In particular, the arrangements of the gate electrode layer 21, the insulating layer 22, the amorphous silicon layer 23, the ohmic contact layer 24 and the metal layer 30 of the active switch being deposited on the first substrate 10 under the first mask are the preparation for subsequent two wet etchings, two dry etching and ashing treatment. A chemical vapor deposition can be used. The arrangements of functional layers for the active switch under the third and fourth masks can ensure the achievement of device function of the active switch.

Figure 11:
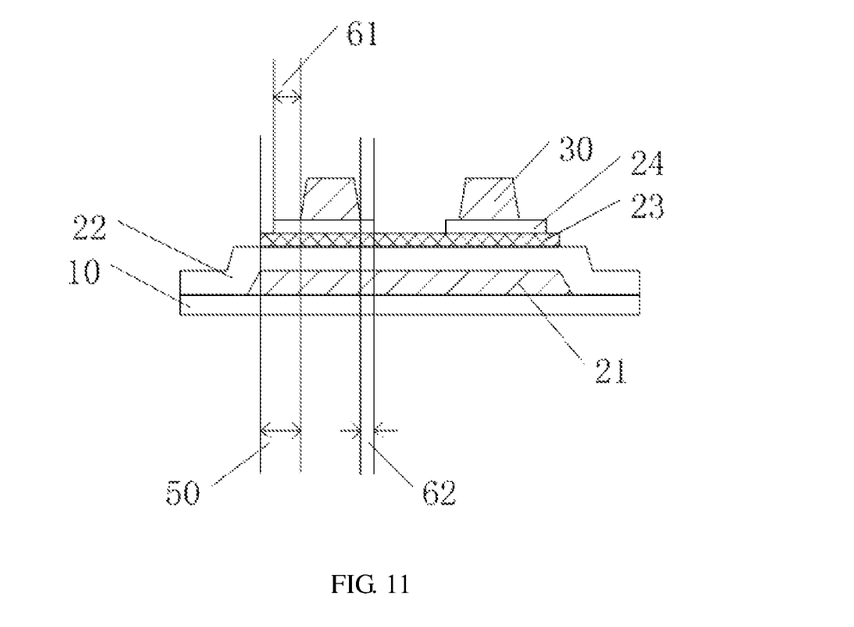
FIG. 11 is a schematic structural view of an active switch of an array substrate according to another embodiment of the disclosure.

As an embodiment of the disclosure, as shown in FIG. 11, the array substrate includes a first substrate 10 and active switches. The active switches are disposed on the first substrate 10. The active switches each include an amorphous silicon layer 23, an ohmic contact layer 24 and a metal layer. A length of an edge of the amorphous silicon layer exceeding the same side edge of the metal layer is greater than a length of an edge of the ohmic contact layer exceeding the same side edge of the metal layer. A length of an outer side edge of the ohmic contact layer beyond the same side edge of the metal layer is greater than a length of an inner side edge of the ohmic contact layer beyond the same side edge of the metal layer. The metal layer contains a residual solution of any one of combinations of phosphoric acid, acetic acid and nitric acid, or a residual solution of any one of phosphoric acid, acetic acid and nitric acid. By reducing the concentration of the nitric acid in the etching solution for the metal layer in the etching steps (2W2D: two wet etchings and two dry etchings), edge lengths of the amorphous silicon layer 23 and the ohmic contact layer 24 of the active switch are controlled to be reduced, so that the risk of line broken caused by relatively small line width in the source/drain electrode layers is reduced consequently.

Specifically, an edge of the amorphous silicon layer 23 is longer with a first tail value 50 than the same side edge of the metal layer, and the first tail value 50 is smaller than 1.2 μm. An edge of the ohmic contact layer 24 is longer with a second tail value than the same side edge of the metal layer, and the second tail value is smaller than 0.8 μm.

More specifically, the second tail values include an outer side second tail value 61 with which the outer side edge of the ohmic contact layer 24 is longer than the same side edge of the metal layer and an inner side second tail value 62 with which the inner side edge of the ohmic contact layer 24 is longer than the same side edge of the metal layer. The outer side second tail value 61 is greater than the inner side second tail value 62. The further limitation under the setting of the second tail values being smaller than 0.8 μm not only can realize the reduction of leakage current but also can ensure normal achievement of function of channel.

In the above embodiments, the display panel may be a liquid crystal panel, an OLED (Organic Light-Emitting Diode) panel, a QLED (Quantum Dot Light Emitting Diodes) panel, a plasma panel, a flat-type panel or a curved-type panel, etc.

Figure 12:
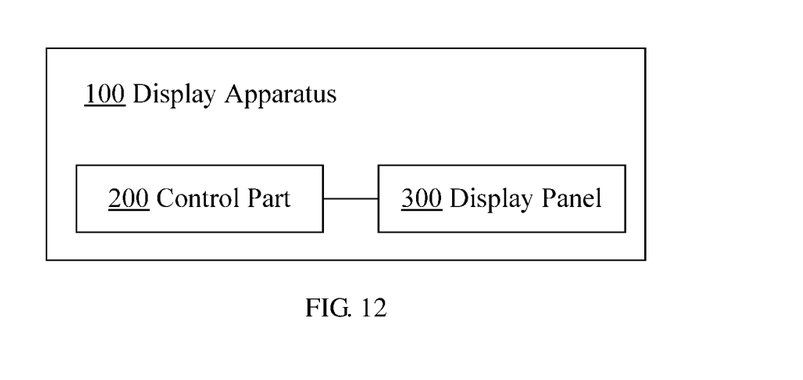
FIG. 12 is a schematic view of a display apparatus according to another embodiment of the disclosure.

Referring to FIG. 12, an embodiment of the disclosure provides a display apparatus 100. The display apparatus 100 includes a control part 200 and the display panel 300 as described in the disclosure. The above uses the display panel as an example to describe in detail, it should be noted that, the above description for the structure of the display panel also is applicable to the display apparatus of the illustrated embodiment of the disclosure. When the display apparatus of the illustrated embodiment of the disclosure is a liquid crystal display, the liquid crystal display includes a backlight module, and the backlight module may be used as a light source and for supplying a light source with sufficient brightness and uniform distribution. The backlight module in the illustrated embodiment may be front light type or backlight type, and it should be noted that the backlight module of the illustrated embodiment is not limited to these.

The foregoing contents are detailed description of the disclosure in conjunction with specific embodiments, and it is not to be determined that the specific embodiments of the disclosure are limited to the description. For the person skilled in the art of the disclosure, without departing from the concept of the disclosure, simple deductions or substitutions can be made and should be included in the protection scope of the application.

What is claimed is:

1. A manufacturing method of an array substrate, comprising steps of:
   providing a first substrate;
   providing a first mask and arranging active switches on the first substrate;
   providing a second mask and forming a photoresist layer on the active switches and then sequentially performing steps of:
      performing a first wet etching on the active switches,
      performing a first ashing treatment on the photoresist layer,
      performing a first dry etching on the active switches,
      performing a second wet etching on the active switches,
      performing a second ashing treatment on the photoresist layer, and
      performing a second dry etching on the active switches;
   providing a third mask and forming a protective layer on a metal layer of the active switches;
   providing a fourth mask and forming a pixel electrode layer on the protective layer;
   wherein the steps of providing a first mask and arranging active switches on the first substrate comprise:
      depositing a gate electrode layer on the first substrate;
      depositing an insulating layer on the gate electrode layer;
      depositing an amorphous silicon layer on the insulating layer;
      depositing an ohmic contact layer on the amorphous silicon layer;
      depositing the metal layer on the ohmic contact layer;
      wherein the protective layer comprises a first protective layer and a second protective layer; the insulating layer, the amorphous silicon layer and the ohmic contact layer constitute a combination layer; the first protective layer is disposed between the combination layer and the metal layer, and the second protective layer is disposed on the metal layer.

2. The manufacturing method of an array substrate according to claim 1, wherein the insulating layer, the amorphous silicon layer and the ohmic contact layer constitute a combination layer;
   wherein the steps of providing a second mask and forming a photoresist layer on the active switches comprise:
      disposing the photoresist layer on the protective layer, and an edge of the photoresist layer being aligned with a same side edge of the metal layer;
   wherein after the step of performing a first wet etching on the active switches, dimension ranges of the metal layer and the protective layer are reduced to a first range;
   wherein after the step of performing a first ashing treatment on the photoresist layer, a dimension range of the photoresist is reduced to a second range;
   wherein after the step of performing a first dry etching on the active switches, a dimension range of the combination layer is reduced to a third range, and an edge of the combination layer is aligned with a same side edge of the metal layer;
   wherein after the step of performing a second wet etching on the active switches, the dimension ranges of the metal layer and the protective layer are reduced to a fourth range.

3. The manufacturing method of an array substrate according to claim 2, wherein the dimension ranges of the metal layer and the protective layer are reduced to a first range comprises: an edge of the combination layer is longer with 0.165 micrometers than a same side edge of the metal layer, and an edge of the metal layer is longer with 0.404 micrometers than a same side edge of the protective layer.

4. The manufacturing method of an array substrate according to claim 2, wherein the dimension ranges of the metal layer and the protective layer are reduced to a fourth range comprises: an edge of the combination layer is distant with a predetermined length from a same side edge of the metal layer, and an edge of the metal layer is longer with 0.404 micrometers than a same side edge of the protective layer.

5. The manufacturing method of an array substrate according to claim 2, wherein after the step of performing a first wet etching on the active switches, the step of performing a first dry etching on the active switches and the step of performing a second wet etching on the active switches, the metal layer has a shape of trapezoid, the trapezoid comprises a first base adjacent to the ohmic contact layer and a second base away from the ohmic contact layer, a length of the first base is greater than a length of the second base, and an edge of the first base is longer with 0.404 micrometers than a same side edge of the second base.

6. The manufacturing method of an array substrate according to claim 1, wherein the metal layer is made of aluminum, and the protective layer is made of molybdenum.

7. A manufacturing method of an array substrate, comprising steps of:
   providing a first substrate;
   providing a first mask and arranging active switches on the first substrate, wherein the active switches comprise a metal layer;
   providing a second mask, forming a photoresist layer on the active switches, performing a first wet etching on the active switches, performing a first dry etching on the active switches, performing a second wet etching on the active switches and performing a second dry etching on the active switches, wherein an etching solution used for etching the metal layer comprises phosphoric acid, acetic acid and nitric acid, and a concentration of the nitric acid in the etching solution is in a range from 1.8% to 3.0%;
   providing a third mask and forming a protective layer on the metal layer;
   providing a fourth mask and forming a pixel electrode layer on the protective layer;
   wherein the steps of providing a first mask and arranging active switches on the first substrate comprise:
      depositing a gate electrode layer on the first substrate;
      depositing an insulating layer on the gate electrode layer;
      depositing an amorphous silicon layer on the insulating layer;
      depositing an ohmic contact layer on the amorphous silicon layer;
      depositing the metal layer on the ohmic contact layer;
      wherein the insulating layer, the amorphous silicon layer and the ohmic contact layer constitute a combination layer;
      wherein edges of the combination layer, the metal layer and the protective layer at a same side are aligned with one another, and the photoresist layer is located in a dimension range of the protective layer.

8. The manufacturing method of an array substrate according to claim 7, wherein a concentration of the phosphoric acid in the etching solution is in a range from 60% to 90%, and a concentration of the acetic acid in the etching solution is in a range from 5% to 15%.

9. The manufacturing method of an array substrate according to claim 7, wherein after the step of performing a first wet etching on the active switches, dimension ranges of the metal layer and the protective layer are reduced to a first range;

after the step of performing a first dry etching on the active switches, a dimension range of the combination layer is reduced to a second range;

after the step of performing a second wet etching on the active switches, the dimension ranges of the metal layer and the protective layer are reduced to a third range.

10. The manufacturing method of an array substrate according to claim 9, after the step of performing a first dry etching on the active switches, further comprising a step of performing an ashing treatment on the photoresist layer;

wherein after the step of performing an ashing treatment on the photoresist layer, a dimension range of the photoresist layer is reduced to a fourth range.

11. The manufacturing method of an array substrate according to claim 9, wherein the dimension range of the combination layer is reduced to the second range and the combination layer has a shape of trapezoid, the trapezoid comprises a first base adjacent to the ohmic contact layer and a second base away from the ohmic contact layer, and a length of the first base is greater than a length of the second base.

12. The manufacturing method of an array substrate according to claim 7, wherein the protective layer comprises a first protective layer and a second protective layer;

the insulating layer, the amorphous silicon layer and the ohmic contact layer constitute a combination layer; the first protective layer is disposed between the combination layer and the metal layer, the second protective layer is disposed on the metal layer, and the first protective layer and the second protective layer uses molybdenum.

13. The manufacturing method of an array substrate according to claim 7, wherein the metal layer uses aluminum, and the protective layer uses molybdenum.

* * * * *